(12) United States Patent
Brown et al.

(10) Patent No.: US 6,281,593 B1
(45) Date of Patent: Aug. 28, 2001

(54) SOI MOSFET BODY CONTACT AND METHOD OF FABRICATION

(75) Inventors: Jeffrey Scott Brown, Middlesex; Andres Bryant, Essex Junction; Robert J. Gauthier, Jr., Hinesburg; Steven Howard Voldman, South Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/455,554

(22) Filed: Dec. 6, 1999

(51) Int. Cl.[7] .................................................. H01L 27/088
(52) U.S. Cl. ......................... 257/901; 257/347; 438/149
(58) Field of Search ..................... 257/355, 356, 257/532, 350, 347, 104, 368, 901; 438/424, 307, 142, 149

(56) References Cited

U.S. PATENT DOCUMENTS

| | | | |
|---|---|---|---|
| 5,075,241 | 12/1991 | Spratt et al. | 437/31 |
| 5,317,181 | 5/1994 | Tyson | 257/347 |
| 5,489,792 | 2/1996 | Hu et al. | 257/347 |
| 5,508,219 | 4/1996 | Bronner et al. | 437/52 |
| 5,525,531 | 6/1996 | Bronner et al. | 437/52 |
| 5,573,961 | 11/1996 | Hsu et al. | 437/21 |
| 5,587,604 | 12/1996 | Machesney et al. | 257/350 |
| 5,610,083 | 3/1997 | Chan et al. | 437/21 |
| 5,670,388 | 9/1997 | Machesney et al. | 437/21 |
| 5,767,549 | 6/1998 | Chen et al. | 257/347 |
| 5,818,085 | 10/1998 | Hsu et al. | 257/347 |
| 5,841,170 | 11/1998 | Adan et al. | 257/345 |
| 5,872,383 | 2/1999 | Yagashita | 257/407 |
| 5,973,364 | * 10/1999 | Kawanaka | . |
| 6,133,799 | * 10/2000 | Favors, Jr. et al. | . |

FOREIGN PATENT DOCUMENTS

11233785-A  *  8/1999 (JP) .

OTHER PUBLICATIONS

Ben G. Streetman, "Solid State Electronic Devices," 1990, Prentice Hall, Third Edition, p. 347.*
S.M. Sze, "Physics of Semiconductor Devices," 1981, John Wiley and Sons, Second Edition, p. 64–65.*

* cited by examiner

Primary Examiner—Nathan Flynn
Assistant Examiner—Kevin Quinto
(74) Attorney, Agent, or Firm—Connolly Bove Lodge & Hutz; Eugene I. Shkurko

(57) ABSTRACT

A body contact to a SOI device is created by providing a deeper buried oxide region for providing connection to the FET body.

10 Claims, 3 Drawing Sheets

SOI MOSFET BODY CONTACT AND METHOD OF FABRICATION

TECHNICAL FIELD

The present invention relates to a thin film siliconon-insulator semiconductor device, and more particularly to a SOI MOSFET having contact to the FET body. In particular, according to the present invention, a body connection region is provided that extends deeper into the substrate under the device's shallow trench isolation region and then back upwards towards a surface of the substrate through a contact region. This body connection region provides an electrical connection to the body of the SOI device. In addition, the present invention relates to a process for fabricating the SOI MOSFET devices of the present invention.

BACKGROUND OF INVENTION

Field effect transistors (FETs) have become the dominant active device for very large scale integration (VLSI) and ultralarge scale integration (ULSI) applications in view of the high performance, high density and low power characteristics of integrated circuit FETs. In fact, much research and development has involved improving the speed and density of FETs and on lowering their power consumption.

The most common configuration of FET devices is the MOSFET which typically comprises source and drain regions in a semiconductor substrate at a first surface thereof, and a gate region located therebetween. The gate includes an insulator on the first substrate surface between the source and drain regions, with a gate electrode or contact on the insulator. A channel is present in the semiconductor substrate beneath the gate electrode, and the channel current is controlled by a voltage at the gate electrode.

More recently, in an attempt to improve the performance of FET devices, such as reducing parasitic capacitance, silicon-on-insulator (SOI) technology has become an increasingly important technique. SOI technology deals with the formation of transistors in a relatively thin monocrystalline semiconductor layer which overlays an insulating layer. The insulating layer is typically formed on an underlying substrate which may be silicon. In other words, the active devices are formed in a thin semiconductor on insulator layer rather than in the bulk semiconductor of the device. Currently, silicon is most often used for this monocrystalline semiconductor layer in which devices are formed. However, it will be understood by those skilled in the art that other monocrystalline layers such as germanium or gallium arsenide may be used. Accordingly, any subsequent reference to silicon will be understood to include any semiconductor material.

High performance and high density integrated circuits are achievable by using the SOI technology because of the reduction of parasitic elements present in integrated circuits formed in bulk semiconductors. For example, for a MOS transistor formed in bulk, parasitic capacitance is present at the junction between the source/drain regions and the underlying substrate, and the possibility of breakdown of the junction between source/drain regions and the substrate regions also exist. A further example of parasitic elements is present for CMOS technology in bulk, where parasitic bipolar transistors formed by n-channel and p-channel transistors in adjacent wells can give rise to latch-up problems. Since SOI structures significantly alleviate parasitic elements, and increase the junction breakdown tolerance of the structure, the SOI technology is well suited for high performance and high density integrated circuits.

The first application of SOI technology was silicon-on-sapphire. Most recent efforts have been directed towards growing monocrystalline silicon on top of a silicon dioxide layer formed on a silicon wafer. See for example the publications entitled "Ultra-high Speed CMOS Circuits in Thin Simox Films" by Camgar et al, Vol. 89, IEDM, pp. 829–832, 1989 and "Fabrication of CMOS on Ultrathin SOI Obtained by Epitaxial Lateral Overgrowth and Chemical-Mechanical Polishing", Shahidi et al, Vol. 90, IEDM, pp. 587–590, 1990.

Furthermore, SOI technology allows for the mapping of standard advanced technologies into a SOI technology without significant modifications. SOI process techniques include epitaxial lateral overgrowth (ELO), lateral solid-phase epitaxy (LSPE) and full isolation by porous oxidized silicon (FIPOS). SOI networks can be constructed using the semiconductor process of techniques of separation by implanted oxygen (SIMOX) and wafer-bonding and etch-back (SIBOND) because they achieve low defect density, thin film control, good minority carrier lifetimes and good channel mobility characteristics. Structural features are defined by shallow-trench isolation (STI). Shallow-trench isolation eliminates planarity concerns and multidimensional oxidation effects, such as LOCOS birds beak, thereby allowing technology migration and scaling to sub $0.25\mu$ technologies.

Although the floating body of a SOI MOSFET provides a number of advantages, including the absence of the reverse-body effect, there are some other problems that such structures possess. Included among the more important problems caused by the device floating body are reduction of the standard saturated threshold voltage and large fluctuations in the linear threshold voltage of the device. The floating-body effects cause problems in circuits that require good threshold voltage (Vt) control and threshold voltage (Vt) matching.

SUMMARY OF INVENTION

The present invention provides for significantly reducing these floating-body problems of SOI devices. In particular, according to the present invention, a body connection region is provided that electrically connects the body of the MOSFET to a contact region. More particularly, the present invention relates to an integrated circuit chip comprising:

a substrate layer on an insulator layer including portions wherein the insulator layer is at an increased depth below the silicon surface which forms a plurality of deeper SOI regions beneath a corresponding plurality of dielectric shallow trench regions in the substrate layer;

a plurality of FETs formed in the substrate layer and spaced apart by dielectric isolation regions in the substrate extending down to the insulator layer;

the FETs each including a gate and a body formed in the substrate layer under the gate of the FET in electrical communication with one of the deeper SOI regions;

a body contact of said each of the FETs formed on a second side of said one of the dielectric shallow trench regions in electrical communication with said one of the deeper SOI regions.

The present invention also relates to a method for fabricating the devices of the present invention. In particular, the method according to the present invention comprises providing a semiconductor substrate, providing a mask on the semiconductor substrate and delineating the mask by providing open regions therein corresponding to subsequently to be formed deep buried oxide regions, implanting oxygen ions through the mask and through the open regions in the mask and thermally annealing to form buried oxide regions, whereby the regions protected by the mask form shallow buried oxide regions and the open regions form deep buried oxide regions.

The mask is removed and dopants of a first type are implanted into the substrate at the locations of the deep buried oxide layer and the channel regions for the subsequently to be created gate structures. Shallow trench isolation is provided for isolating FET structures from each other. A gate conductor is located above the gate insulating layer, and source and drain regions of a second conductivity type opposite from the conductivity type of the semiconductor SOI layer is provided.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

In order to facilitate an understanding of the present invention, reference will be made to the figures. For convenience, when the discussion of the fabrication steps of the present invention refer to a particular type of substrate and/or particular type of dopant impurities, it is understood that the present invention is applicable to the opposite type without departing from the spirit of the present invention. For instance, when reference is made to a p-type silicon substrate as the semiconductor substrate, and n-type impurities as diffused or implanted dopant impurities, it is understood that a n-type substrate and p-type diffused or implanted dopant impurities are likewise suitable. In addition, it is understood that when the discussion refers to n-type impurities, the process steps are applicable to p-type impurities, and vice versa. Also, when reference is made to impurities of a "first type" and to impurities of a "second type", it is understood that the "first type" refers to n- or p-type impurities and "second type" refers to the opposite conductivity type. That is, if the "first type" is p, then the "second type" is n. If the "first type" is n, then the "second type" is p.

Also, the present invention is applicable to substrates other than silicon as known in the art. Moreover, the terms "polysilicon" and "polycrystalline silicon" are used herein interchangeably.

Figure 1:
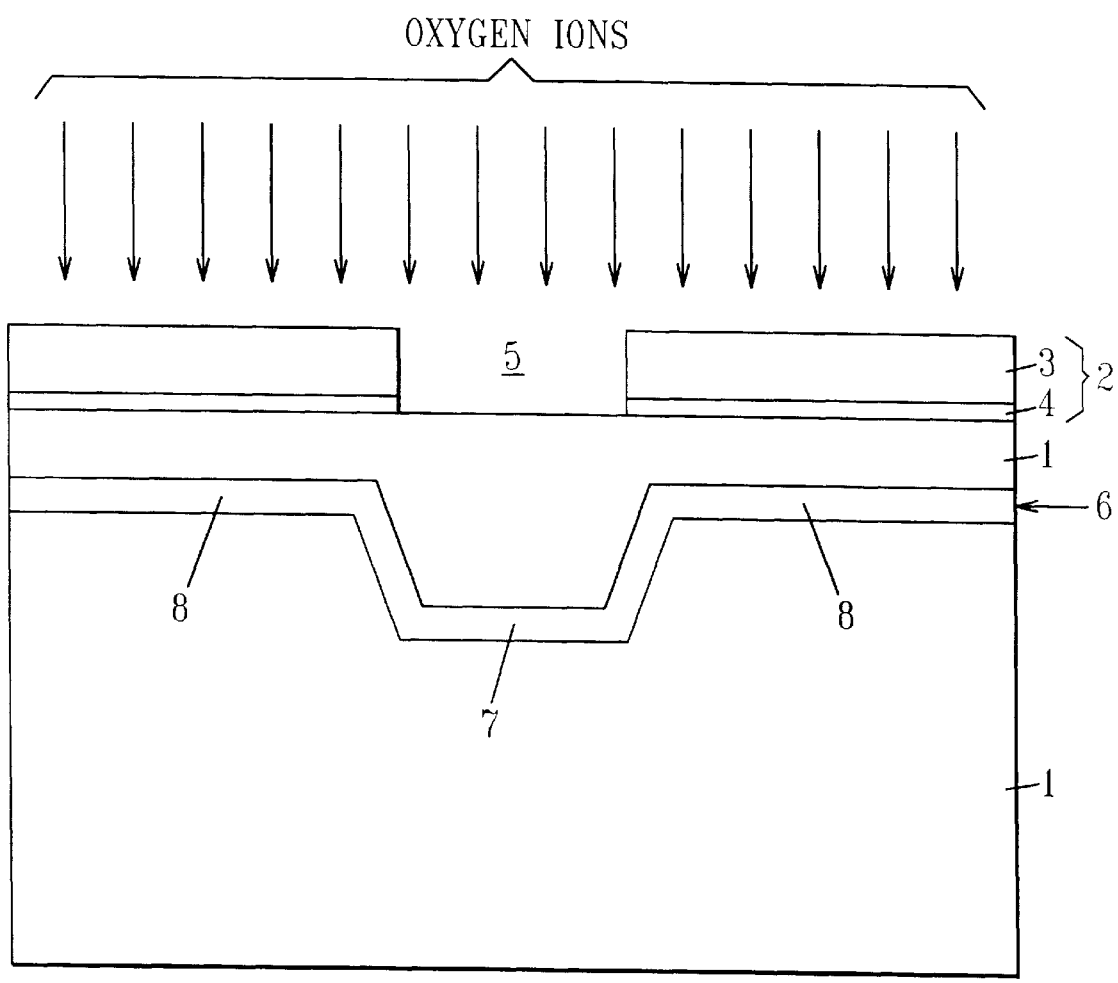
FIGS. 1 and 2 are cross-section diagrams of the device at different stages of fabrication according to the present invention.

FIG. 1 illustrates providing a bulk semiconductor substrate 1 such as a silicon substrate having <100> crystal structure. A mask 2 is provided on the substrate and delineated by well known techniques to provide openings 5. Suitable masking materials include a combination of silicon nitride 3 and silicon oxide 4. The mask is typically about 1500 to about 5000 Å thick and more typically about 2500 Å thick. oxygen ions are implanted through the mask and through the openings 5 in the mask thereby providing a dual depth buried oxide layer 6. In particular, the buried oxide layer 6 in the regions corresponding to the openings 5 in the mask are deeper than those corresponding to the mask as shown in FIG. 1. After implanting, the structure is subjected to thermal anneal at temperatures of about 1000° C. to about 1400° C. in order to form the desired buried oxide layer 6. The deep buried oxide portion 7 is typically greater than about 0.4 microns from the top of the substrate and more typically about 0.45 to about 0.55 microns from the top of the substrate. The shallower buried oxide portion 8 is typically up to about 0.3 microns from the top of the substrate 1, more typically about 0.05 to about 0.3 microns, and preferably about 0.15 microns. The oxygen ions are typically implanted at dosages of about 5E1 to about 5E18 and energy of about 100 Kev to about 250 Kev. The annealing temperature is typically about 1350° C. The deeper buried oxide regions 7 will provide for the body contact.

The mask can be removed using a suitable nitride/oxide etch such as phosphoric acid and hydrofluoric acid.

The top portion of the silicon layer can be doped either in n-type or p-type, depending on the desired structure. The doping can be carried out by ion implantation or thermal diffusion. P-type dopants for silicon include boron and indium. N-type dopants for silicon include phosphorous, arsenic and antimony.

Shallow trench isolation (STI) 9 (see FIG. 2) can be provided such as by employing reactive ion etching followed by filling the trench or recess created by the reactive ion etching by chemical vapor deposition of silicon dioxide. The upper surface is then planarized by chemical-mechanical polishing. The STI is typically created to a depth to coincide with the buried oxide layer and in the case of the present invention, with the shallower portion 8 of the buried oxide layer 6.

Next, a dielectric layer 10 is formed on top of the semiconductor substrate along with active devices which are exemplified by the gates 11. The gate can be provided, for instance, by depositing a layer of polycrystalline silicon by chemical vapor deposition followed by doping such as with an n-type dopant such as arsenic, phosphorous or antimony by any one of several techniques. A thin additional layer of silicon oxide can be deposited on the polysilicon if desired such as by chemical vapor deposition. This would serve as an etching mask to help delineate the polycrystalline silicon material. The gate can be delineated by well known techniques. For instance, a gate pattern determining layer such as a layer of resist material (not shown) of the type employed in non-lithographic masking and etching techniques can be placed over the surface of the polycrystalline silicon. Any of the well known radiation sensitive resist materials known in the art may be used. The resist material can be applied such as by spinning or by spraying.

After the layer of resist material is applied, it can then be selectively exposed to radiation such as ultraviolet radiation using a lithographic mask. Portions of the photoresist material and the polysilicon material except for the desired gate region are removed. The dielectric layer exposed upon removal of polysilicon material is then removed after which the remaining portion of the photoresist material above the gate region can be removed.

Figure 3:
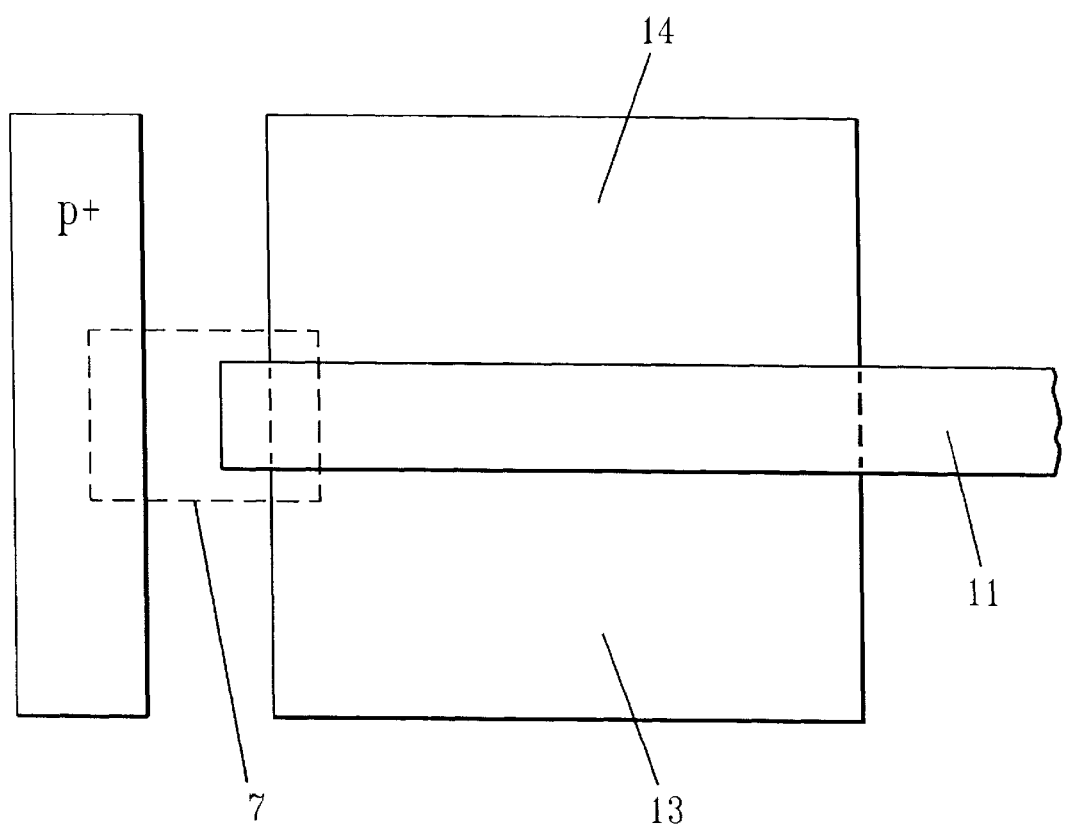
FIG. 3 is a layout view illustrating the body contact created in accordance with the present invention.

Source 13 and drain 14 regions can then be provided by ion implantation of a n-type dopant (see FIG. 3).

Typically, the n-type dopant is implanted at a dosage of about 2E15 to about 5E15, and at an energy level of about 20 Kev to about 50 Kev for arsenic.

Figure 2:
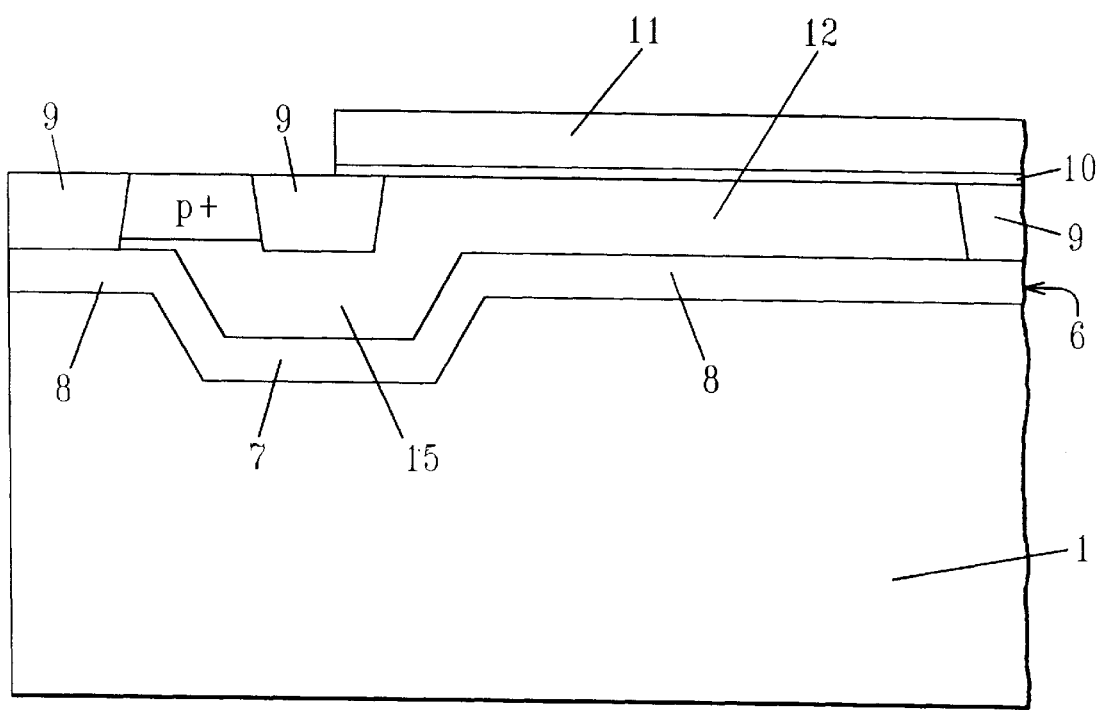

As can be appreciated from FIG. 2, the deeper buried oxide region 7 provides for electrical contact to the channel region 12 of the FET. The deeper buried oxide region created at the edge of the FET provides for electrical contact to the FET body through the body connection region 15 under the STI isolation 9. Moreover, it minimizes the impact of the device and particularly minimizes the impact to junction capacitance.

The foregoing description of the invention illustrates and describes the present invention. Additionally, the disclosure shows and describes preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. An integrated circuit chip comprising:
    a substrate layer on an insulator layer wherein the substrate layer has a non-planar bottom surface and the insulator layer has a non-planar top surface and a non-planar bottom surface; and wherein both the substrate layer and the insulator layer together form a plurality of downward dips providing deeper connecting regions beneath a corresponding plurality of dielectric shallow trench regions in the substrate layer;
    a plurality of FETs formed in the substrate layer and spaced apart by dielectric isolation regions in the substrate extending down to the insulator layer;
    the FETs each including a gate and a body formed in the substrate layer under the gate in electrical communication with one of the deeper connecting regions; and
    a body contact of said each of the FETs formed on a second side of said one of the dielectric shallow trench regions in electrical communication with said one of the deeper connecting regions.

2. The integrated circuit chip of claim 1 wherein the substrate comprises silicon.

3. The integrated circuit chip of claim 1 wherein the dielectric isolation regions comprise silicon dioxide.

4. The integrated circuit chip of claim 1 wherein the downward dips extend at least 0.5 microns from the top of the substrate.

5. The integrated circuit chip of claim 1 wherein the downward dips are located about 0.45 to about 0.55 microns from the top of the substrate.

6. The integrated circuit chip of claim 1 wherein the insulator layer includes shallow regions located up to about 0.3 microns from the top of the substrate.

7. The integrated circuit chip of claim 1 wherein the insulator layer includes shallow regions located about 0.05 to about 0.3 microns from the top of the substrate.

8. The integrated circuit chip of claim 1 wherein the shallow trench isolation comprises silicon dioxide.

9. The integrated circuit chip of claim 1 wherein the gates comprise polysilicon.

10. The integration circuit chip of claim 1 wherein the substrate layer has a planar surface.

* * * * *